(12) United States Patent
Lin et al.

(10) Patent No.: US 10,648,708 B2
(45) Date of Patent: May 12, 2020

(54) THERMOELECTRIC MODULE

(71) Applicant: INDUSTRIAL TECHNOLOGY RESEARCH INSTITUTE, Hsinchu (TW)

(72) Inventors: Yu-Li Lin, Chiayi (TW); Yi-Ray Chen, Hsinchu (TW); Bo-Yi Sung, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 326 days.

(21) Appl. No.: 15/476,893

(22) Filed: Mar. 31, 2017

(65) Prior Publication Data
US 2018/0172324 A1    Jun. 21, 2018

(30) Foreign Application Priority Data

Dec. 15, 2016 (TW) .............................. 105141653 A

(51) Int. Cl.
*F25B 21/02* (2006.01)
*H01L 35/32* (2006.01)
(Continued)

(52) U.S. Cl.
CPC .......... *F25B 21/02* (2013.01); *H01L 27/0211* (2013.01); *H01L 27/16* (2013.01);
(Continued)

(58) Field of Classification Search
CPC ..... H01L 27/0211; H01L 27/16; H01L 35/08; H01L 35/10; H01L 35/32; H01L 37/00; F25B 21/02
See application file for complete search history.

(56) References Cited

U.S. PATENT DOCUMENTS 8,889,453 B2 * 11/2014 Park .................. H01L 35/16
257/E31.054
8,921,679 B2 * 12/2014 Fann .................. H01L 35/325
136/224
(Continued)

FOREIGN PATENT DOCUMENTS

EP    0 506 093 A1    9/1992
EP    2 787 545 A1    10/2014
(Continued)

OTHER PUBLICATIONS

TiOx based thermoelectric modules—manufacturing, properties and operational behavior, Jochen Schilm, Andreas Ponicke, Martin Kluge, Ina Sichert, Hans-Peter Martin, Alexander Michaelis, 12th European Conference on Thermoelectrics, 2012, p. 770-779 (2012).

(Continued)

*Primary Examiner* — Filip Zec
(74) *Attorney, Agent, or Firm* — Maschoff Brennan

(57) ABSTRACT

A thermoelectric module includes a plurality of thermoelectric components, a first electrode and a second electrode. The thermoelectric components have the same type of semiconductor material. The first electrode includes a first parallel connection part and a first serial connection part. The plurality of thermoelectric components is electrically connected to the first parallel connection part and each of the plurality of thermoelectric components is separated from one another. The first serial connection part is configured for being electrically connected to other electrical components. The plurality of thermoelectric components is electrically connected to the second electrode and located between the first parallel connection part and the second electrode.

13 Claims, 15 Drawing Sheets

(51) Int. Cl.
  *H01L 35/08* (2006.01)
  *H01L 27/02* (2006.01)
  *H01L 27/16* (2006.01)
  *H01L 35/10* (2006.01)
  *H01L 37/00* (2006.01)

(52) U.S. Cl.
  CPC .............. *H01L 35/08* (2013.01); *H01L 35/10* (2013.01); *H01L 35/32* (2013.01); *H01L 37/00* (2013.01)

(56) References Cited

U.S. PATENT DOCUMENTS

| | | | |
|---|---|---|---|
| 2006/0048809 | A1 | 3/2006 | Onvural |
| 2010/0288325 | A1* | 11/2010 | Takahashi ............... H01L 35/06 136/205 |
| 2014/0182644 | A1 | 7/2014 | Aguirre et al. |
| 2015/0303366 | A1* | 10/2015 | Yoshimi .................... B22C 9/04 136/205 |
| 2016/0005947 | A1 | 1/2016 | Suda et al. |

FOREIGN PATENT DOCUMENTS

| | | |
|---|---|---|
| EP | 3 054 493 A1 | 8/2016 |
| JP | 2006-019422 A | 1/2006 |
| JP | 2006-237050 A | 9/2006 |
| JP | 2007073889 A | 3/2007 |
| JP | 2008-010764 A | 1/2008 |
| JP | 2008010764 A | 1/2008 |
| JP | 2009-176919 A | 8/2009 |
| JP | 4904193 B2 | 3/2012 |
| JP | 2015-070217 A | 4/2015 |
| JP | WO 2015/045500 * | 4/2015 ............ H01L 35/32 |
| JP | 2016-111309 A | 6/2016 |
| TW | 200935635 A | 8/2009 |
| TW | 201044654 A | 12/2010 |
| TW | I360241 B | 3/2012 |
| TW | 201234686 A | 8/2012 |
| TW | 201327952 A | 7/2013 |
| TW | 201605083 A | 2/2016 |
| TW | 201622189 A | 6/2016 |
| WO | 2009/013960 A1 | 1/2009 |
| WO | 2012091048 A1 | 7/2012 |

OTHER PUBLICATIONS

Processing and doping of thick polymer active layers for flexible organic thermoelectric modules, Sunbin Hwang, William J. Potscavage Jr., Ryosuke Nakamichi, Chihaya Adachi, Organic Electronics 2016, p. 31-40 (2016).
Determination of Thermoelectric Module Parameters, Solomon M., Gorodetskiy, 18th International Conference on Thermoelectrics, 1999.
Analyses and Applications of Thermoelectric Modules: Electrically Parallel and Serial Structures Guangxi Wu Submitted Dissertation of Doctor of Philosophy Case Western Reserve University, 2016.
TW Office Action dated Jul. 31, 2017 as received in Application No. 105141653.
EP Extended European Search Report dated Oct. 25, 2017 as received in Application No. 17168398.
Japanese Office Action in corresponding application No. 2017-080551, dated Jun. 12, 2018.
EP Extended European Search Report dated Oct. 25, 2017 as received in Application No. 17168398.0.

* cited by examiner

THERMOELECTRIC MODULE

CROSS-REFERENCE TO RELATED APPLICATIONS

This non-provisional application claims priority under 35 U.S.C. § 119(a) on Patent Application No(s). 105141653 filed in Taiwan, R.O.C. on Dec. 15, 2016, the entire contents of which are hereby incorporated by reference.

TECHNICAL FIELD

The disclosure relates to a thermoelectric module, more particularly to a thermoelectric module having a plurality of thermoelectric components having the same type of semiconductor material.

BACKGROUND

Regarding the development of thermoelectric module, there are two types of thermoelectric modules. In one type of the thermoelectric modules, two ends of its thermoelectric component are connected with direct current (DC), and then a temperature difference occurs between these two ends. This type of thermoelectric module can be applied to a mini refrigerator, a condensing dehumidifier, an insulation coasters and the like. In another type of thermoelectric module, when two ends of its thermoelectric component have a temperature difference, these two ends generate direct current. This type of thermoelectric module can be applied to an energy recovering apparatus for recovering waste heat, a charger for a coaster and the like.

In conventional thermoelectric modules, the thermoelectric components can be divided into two groups having different types of semiconductor material, wherein one group consists of multiple N-type thermoelectric components, and the other group consists of multiple P-type thermoelectric components. Each of the N-type thermoelectric components and the P-type thermoelectric components is placed alternately one after another, and the N-type thermoelectric components are electrically connected to P-type thermoelectric components.

SUMMARY

The present disclosure provides a thermoelectric module having thermoelectric components that are made of the same material.

One embodiment of the disclosure provides a thermoelectric module including a plurality of thermoelectric components, a first electrode and a second electrode. The thermoelectric components have the same type of semiconductor material. The first electrode includes a first parallel connection part and a first serial connection part. The plurality of thermoelectric components is electrically connected to the first parallel connection part, and each of the plurality of thermoelectric components is separated apart from one another. The first serial connection part is configured for being electrically connected to other electrical components. The plurality of thermoelectric components is electrically connected to the second electrode and located between the first parallel connection part and the second electrode.

BRIEF DESCRIPTION OF THE DRAWINGS

The present disclosure will become better understood from the detailed description given hereinbelow and the accompanying drawings which are given by way of illustration only and thus are not limitative of the present disclosure and wherein.

DETAILED DESCRIPTION

Figure 1:
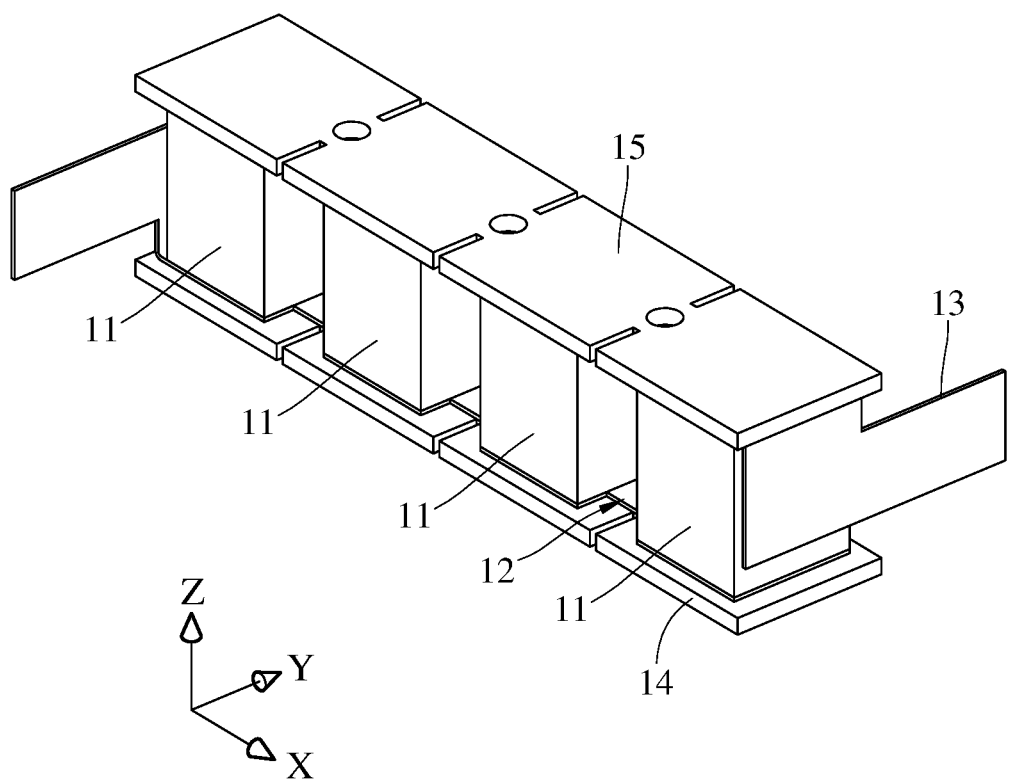
FIG. 1 is a perspective view of a thermoelectric module according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The drawings may not be drawn to actual size or scale, some exaggerations may be necessary in order to emphasize basic structural relationships, while some are simplified for clarity of understanding, and the present disclosure is not limited thereto. It is allowed to have various adjustments under the spirit of the present disclosure. In the specification, the term "on" may be described as "one is located above another" or "one is in contact with another". In addition, the terms "top side", "bottom side", "above" and "below" are used to illustrate but limit the present disclosure. The term "substantially" is referred to the complete or nearly complete extent or degree of a structure, which means that it is allowable to have tolerance during manufacturing.

Please refer to FIG. 1, which is a perspective view of a thermoelectric module according to one embodiment of the disclosure. In this embodiment, a thermoelectric module 1 is provided. The thermoelectric module 1 includes a plurality of thermoelectric components 11, a first electrode 12, a second electrode 13, a first base board 14 and a second base board 15.

The thermoelectric components 11 have the same type of semiconductor material. Specifically, each thermoelectric component 11 is made of p-type semiconductor material, or alternatively, each thermoelectric component 11 is made of n-type semiconductor material. From the point of view of FIG. 1, each thermoelectric component 11 has a first length along the X-axis, a second length along the Y-axis, and a third length along the Z-axis. The first length ranges from 1 millimeters (mm) to 60 mm. The second length ranges from 1 mm to 60 mm. The third length ranges from 0.6 mm to 25 mm. Each thermoelectric component 11 has two end surfaces having two edges equal to the first length and the other two edges equal to the second length. The two end surfaces are respectively electrically connected to the first electrode 12 and the second electrode 13. The thermoelectric components 11 are spaced apart from one another, and the thermoelectric components 11 are in parallel connection through the first electrode 12 and the second electrode 13. The first base board 14 is disposed on the first electrode 12, and the second base board 15 is disposed on the second electrode 13. In this embodiment, the first base board 14 and the second base board 15 both are made of, for example, ceramics, but the present disclosure is not limited thereto. In some embodiments, both the first base board 14 and the second base board 15 may be made of a composite material composed of an outer layer made of ceramics and an inner layer made of metal, and the ceramics is in electrical insulation.

Figure 2:
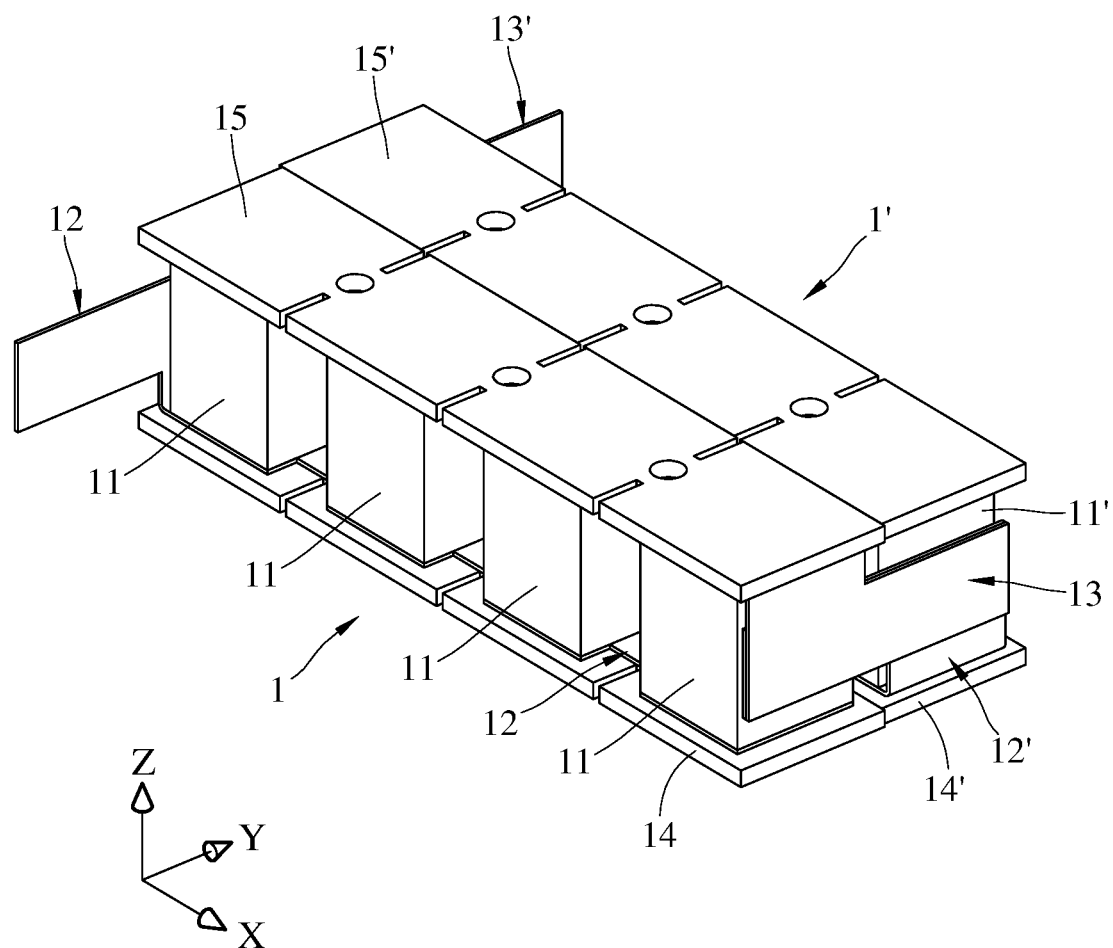
FIG. 2 is a perspective view of the thermoelectric module in FIG. 1 and another thermoelectric module in serial connection.
Figure 3:
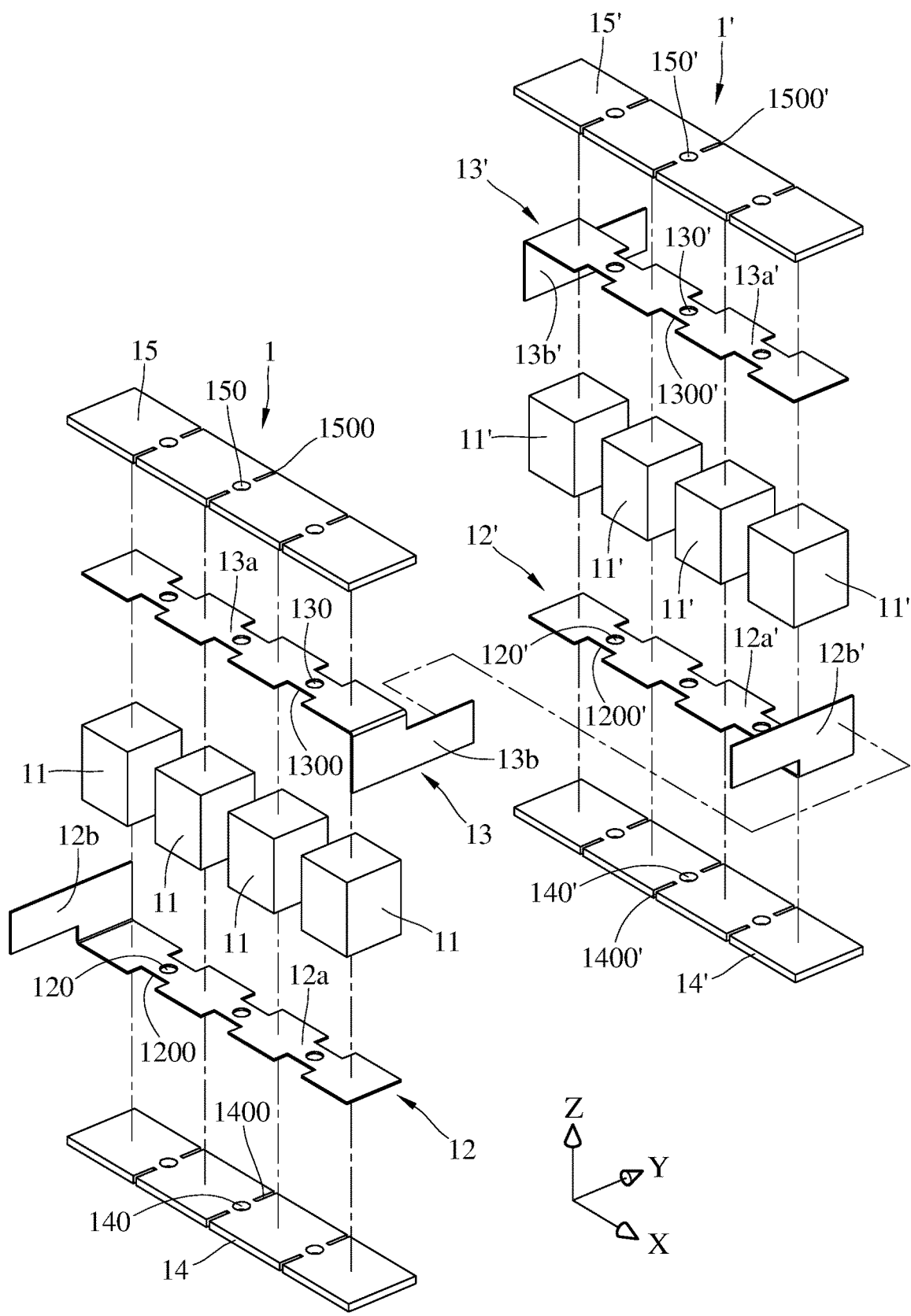
FIG. 3 is an exploded view of the thermoelectric modules in FIG. 2.

Please refer to FIG. 2 and FIG. 3. FIG. 2 is a perspective view of the thermoelectric module in FIG. 1 and another thermoelectric module in serial connection, and FIG. 3 is an exploded view of the thermoelectric modules in FIG. 2. In the thermoelectric module 1, the first electrode 12 includes a parallel connection part 12a and a serial connection part 12b which are integral with each other. The second electrode 13 includes a parallel connection part 13a and a serial connection part 13b which are integral with each other. The thermoelectric module 1 is in serial connection with another thermoelectric module 1'.

The thermoelectric components 11 are separated apart from one another, and the thermoelectric components 11 are in parallel connection through the parallel connection part 12a of the first electrode 12 and the parallel connection part 13a of the second electrode 13. The thermoelectric components 11 are located between the parallel connection part 12a of the first electrode 12 and the parallel connection part 13a of the second electrode 13.

The thermoelectric module 1' includes a plurality of thermoelectric components 11', a first electrode 12', a second electrode 13', a first base board 14' and a second base board 15'. The thermoelectric components 11' have the same type of semiconductor material. The first electrode 12' includes a parallel connection part 12a' and a serial connection part 12b' which are integral with each other. The second electrode 13' includes a parallel connection part 13a' and a serial connection part 13b' which are integral with each other. The thermoelectric components 11' are in parallel connection through the parallel connection part 12a' of the first electrode 12' and the parallel connection part 13a' of the second electrode 13'. The thermoelectric components 11' are located between the parallel connection part 12a' of the first electrode 12' and the parallel connection part 13a' of the second electrode 13'. The first base board 14' is disposed on the first electrode 12', and the second base board 15' is disposed on the second electrode 13'. The serial connection part 13b of the second electrode 13 of the thermoelectric module 1 is electrically connected to the serial connection part 12b' of the first electrode 12' of the thermoelectric module 1', so that the thermoelectric module 1 and the thermoelectric module 1' are in serial connection. In this embodiment, the direction of the arrangement of the thermoelectric components 11 of the thermoelectric module 1 is substantially the same as the direction of the arrangement of the thermoelectric components 11' of the thermoelectric module 1', and the direction of the arrangement of the thermoelectric modules 1 and 1' is substantially perpendicular to the direction of the arrangement of the thermoelectric components 11, but the present disclosure is not limited thereto. In some embodiments, the direction of the arrangement of the thermoelectric modules 1 and 1' and the direction of the arrangement of the thermoelectric components 11 may be the same or have an angle over or less than 90 degrees therebetween.

The parallel connection part 12a has a plurality of buffering holes 120 and a plurality of buffering notches 1200. The parallel connection part 13a has a plurality of buffering holes 130 and a plurality of buffering notches 1300. The buffering holes 120, the buffering notches 1200, the buffering holes 130 and the buffering notches 1300 are located between each thermoelectric component 11. The parallel connection part 12a' has a plurality of buffering holes 120' and a plurality of buffering notches 1200'. The parallel connection part 13a' has a plurality of buffering holes 130' and a plurality of buffering notches 1300'. The buffering holes 120', the buffering notches 1200', the buffering holes 130' and the buffering notches 1300' are located between each thermoelectric component 11'. The first base board 14 has a plurality of buffering holes 140 and a plurality of buffering notches 1400. The second base board 15 has a plurality of buffering holes 150 and a plurality of buffering notches 1500. The buffering holes 140, the buffering notches 1400, the buffering holes 150 and the buffering notches 1500 are located between each thermoelectric component 11. The first base board 14' has a plurality of buffering holes 140' and a plurality of buffering notches 1400'. The second base board 15' has a plurality of buffering holes 150' and a plurality of buffering notches 1500'. The buffering holes 140', the buffering notches 1400', the buffering holes 150' and the buffering notches 1500' are located between each thermoelectric component 11'. The buffering holes 120 and 130, the buffering notches 1200 and 1300, the buffering holes 140 and 150, and the buffering notches 1400 and 1500 are able to provide buffering to the thermoelectric module 1 while temperature is changing. The buffering holes 120' and 130', the buffering notches 1200' and 1300', the buffering holes 140' and 150', and the buffering notches 1400' and 1500' are able to provide buffering to the thermoelectric module 1' while temperature is changing. Accordingly, the thermoelectric module 1 and the thermoelectric module 1' are prevented from separating from each other due to temperature difference. It is noted that the present disclosure is not limited to the numbers of the buffering holes and the buffering notches in the aforementioned embodiment, in some embodiments, each parallel connection part may only have one buffering hole and one buffering notch, and each base board may only have one buffering hole and one buffering notch.

In this embodiment, in the first electrode 12, the buffering notches 1200 are located at two sides of the first electrode 12 opposite to each other, and the buffering holes 120 respectively correspond to and are located between the buffering notches 1200; in the first electrode 12', the buffering notches 1200' are located at two sides of the first electrode 12' opposite to each other, and the buffering holes 120' respectively correspond to and are located between the buffering notch 1200'; in the second electrode 13, the buffering notches 1300 are located at two sides of the second electrode 13 opposite to each other, and the buffering holes 130 respectively correspond to and are located between the buffering notches 1300; and in the second electrode 13', the buffering notches 1300' are located at two sides of the second electrode 13' opposite to each other, and buffering holes 130' respectively correspond to and are located between the buffering notches 1300'. In this embodiment, on the first base board 14, the buffering notches 1400 are located at two sides of the first base board 14 opposite to each other, and the buffering holes 140 respectively correspond to and are located between the buffering notches 1400; and in the first base board 14', the buffering notches 1400' are located at two sides of the first base board 14' opposite to each other, and the buffering holes 140' respectively correspond to and are located between the buffering notches 1400'. In this embodiment, in the second base board 15, the buffering notches 1500 are located at two sides of the second base board 15 opposite to each other, and the buffering holes 150 respectively correspond to and are located between the buffering notches 1500; and in the second base board 15', the buffering notches 1500' are located at two sides of the second base board 15' opposite to each other, and the buffering holes 150' respectively correspond to and are located between the buffering notches 1500'.

Figure 4:
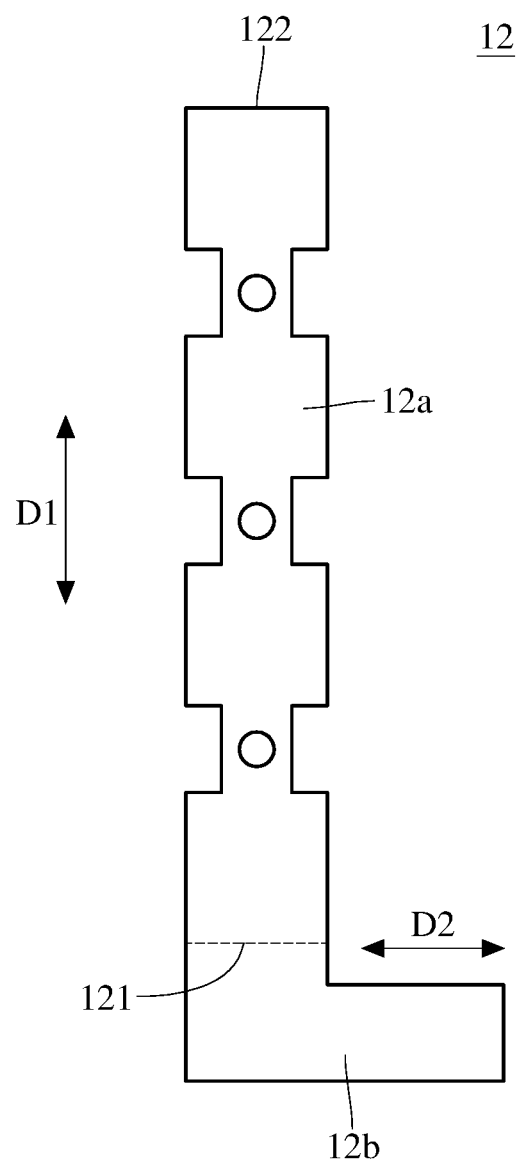
FIG. 4 is a planar view of a semi-finished first electrode in FIG. 1.

Please refer to FIG. 4, which is a planar view of a semi-finished first electrode in FIG. 1. FIG. 4 shows a semi-finished first electrode 12, and shapes of the semi-finished first electrode 12' and the semi-finished second electrodes 13 and 13' are similar to or the same as the shape of the semi-finished first electrode 12. In the semi-finished first electrode 12, the parallel connection part 12a has a first side 121 and a second side 122, and extends in a first extension direction D1. The first extension direction D1 is substantially parallel to a direction pointing from the first side 121 toward the second side 122. As shown in FIG. 1, the thermoelectric components 11 are arranged along the first extension direction D1. The serial connection part 12b extends a distance from the first side 121 along the first extension direction D1, and then extends along a second extension direction D2. The second extension direction D2 is substantially parallel to the first side 121. That is, the serial connection part 12b has a first portion which extends from the first side 121 along the first extension direction D1, and a second portion which extends along the second extension direction D2 substantially parallel to the first side 121. The first side 121 is taken as a bend line, so the serial connection part 12b is able to be bent toward the second electrode 13 at the first side 121. As a result, the first electrode 12 is finished. That is, during the manufacturing process of the first electrode 12, the first electrode 12 is a whole sheet, and then some parts of the first electrode 12 are being cut out, and then the first electrode 12 is being bent.

Figure 5:
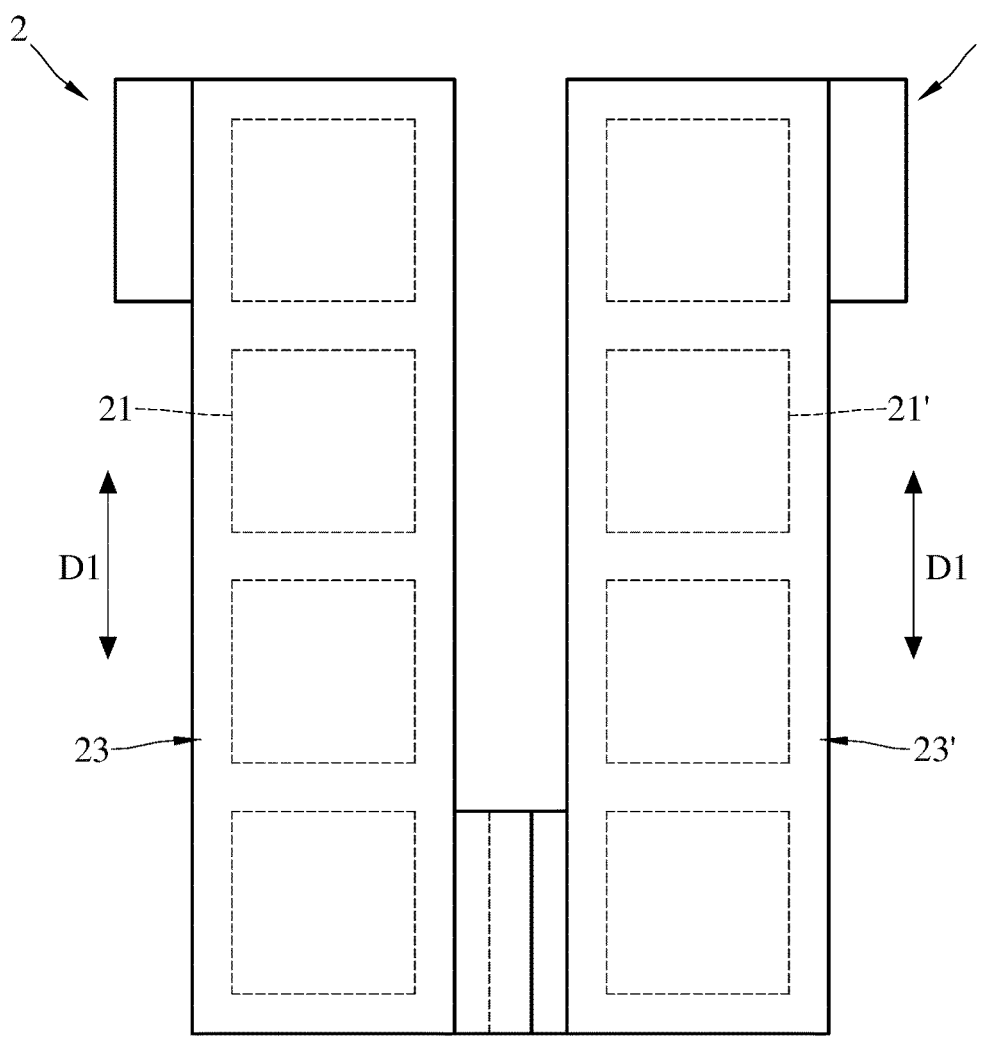
FIG. 5 is a top view of a thermoelectric module connected to another thermoelectric module according to another embodiment of the disclosure.
Figure 6:
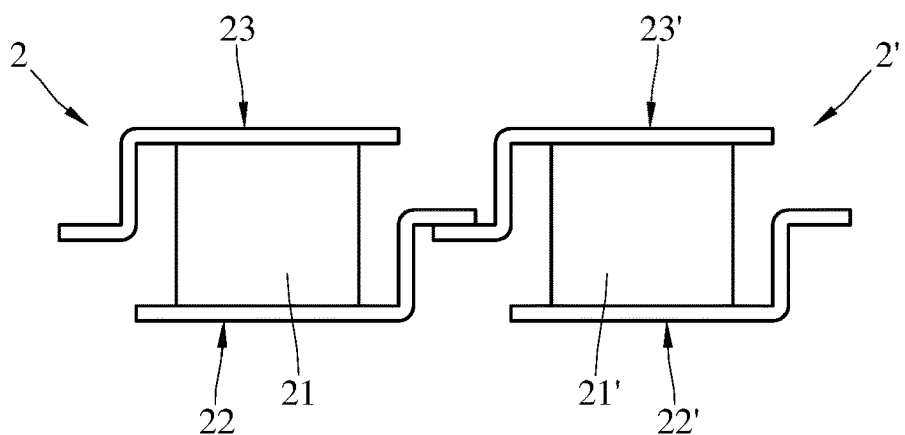
FIG. 6 is a side view of the thermoelectric modules in FIG. 5.
Figure 7:
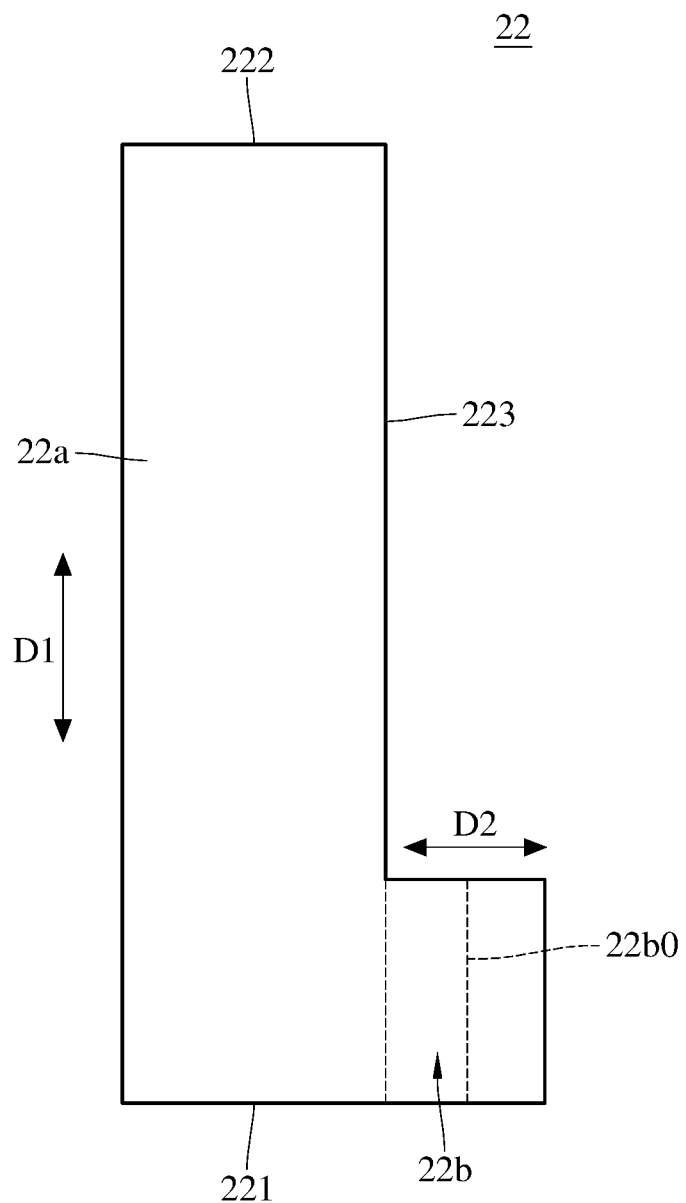
FIG. 7 is a planar view of a semi-finished first electrode in FIG. 6.

Please refer to FIG. 5, FIG. 6 and FIG. 7. FIG. 5 is a top view of a thermoelectric module connected to another thermoelectric module according to another embodiment of the disclosure, FIG. 6 is a side view of the thermoelectric modules in FIG. 5, and FIG. 7 is a planar view of a semi-finished first electrode in FIG. 6. In this embodiment, a thermoelectric module 2 and a thermoelectric module 2' are provided. The thermoelectric modules 2 and 2' are similar to the thermoelectric modules 1 and 1'. The thermoelectric components 21 are located between the first electrode 22 and the second electrode 23, and are in parallel connection through the first electrodes 22 and the second electrode 23. The thermoelectric components 21' are located between the first electrode 22' and the second electrode 23', and are in parallel connection through the first electrode 22' and the second electrode 23'. The first electrode 22 and the second electrode 23' are electrically connected to each other so that the thermoelectric module 2 and the thermoelectric module 2 are in serial connection. However, in this embodiment, there are no base boards 14 and 15; in addition, the shapes of the first electrodes 22 and 22' and the second electrodes 23 and 23' are different from that in FIG. 2. FIG. 7 shows a semi-finished first electrode 22, and it is noted that shapes of the semi-finished first electrode 22' and the semi-finished second electrodes 23 and 23' are similar to or the same as the shape of the semi-finished first electrode 22.

The first electrode 22 includes a parallel connection part 22a and a serial connection part 22b. The parallel connection part 22a and the serial connection part 22b are integral with each other. The parallel connection part 22a has a first side 221, a second side 222 and a third side 223. The first side 221 and the second side 222 are opposite to each other, and the third side 223 is located between the first side 221 and the second side 222. The parallel connection part 22a extends along a first extension direction D1 which is substantially parallel to a direction pointing from the first side 221 toward the second side 222. As shown in FIG. 5, the thermoelectric components 21 are arranged along the first extension direction D1. The serial connection part 22b extends a distance from the third side 223 along a second extension direction D2. The second extension direction D2 is substantially parallel to the first side 221. The third side 223 is taken as a bend line, so the serial connection part 22b is able to be bent toward the second electrode 23 at the third side 223. In addition, the serial connection part 22b has another bend line 22b0 substantially parallel to the third side 223. The serial connection part 22b is able to be bent at the bend line 22b0, so that a part of the serial connection part 22b is able to be bent away from the thermoelectric component 21. That is, during the manufacturing process of the first electrode 22, the first electrode 22 is a whole sheet, and then some parts of the first electrode 22 are being cut out, and then the first electrode 22 is being bent.

In this embodiment, the serial connection part 22b is connected to an end part of the third side 223, but the present disclosure is not limited thereto. In some embodiments, the serial connection part 22b may be connected to a middle part of the third side 223 or a part close to the middle part of the third side 223.

Figure 8:
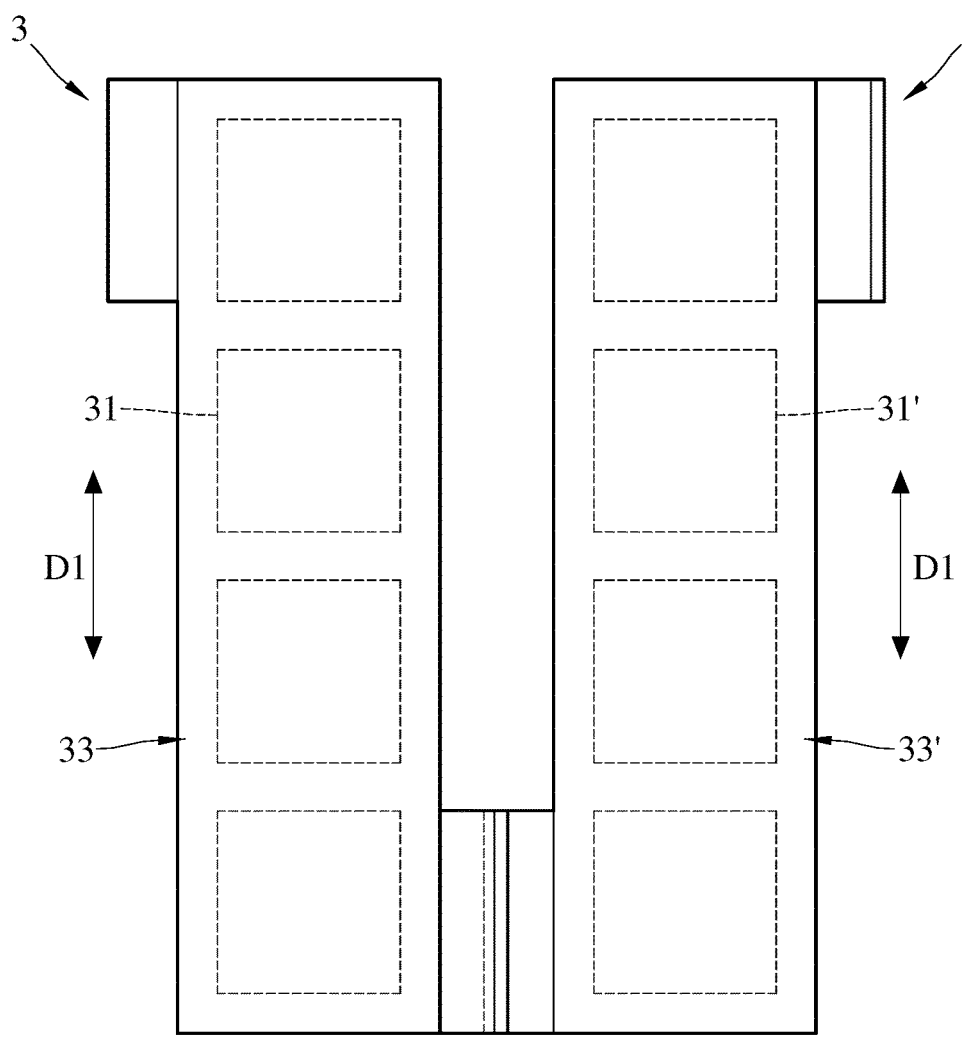
FIG. 8 is a top view of a thermoelectric module connected to another thermoelectric module according to yet another embodiment of the disclosure.
Figure 9:
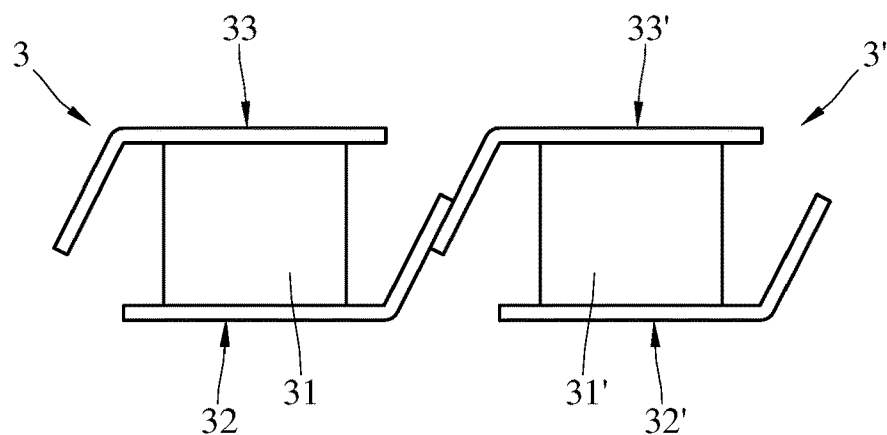
FIG. 9 is a side view of the thermoelectric modules in FIG. 8.
Figure 10:
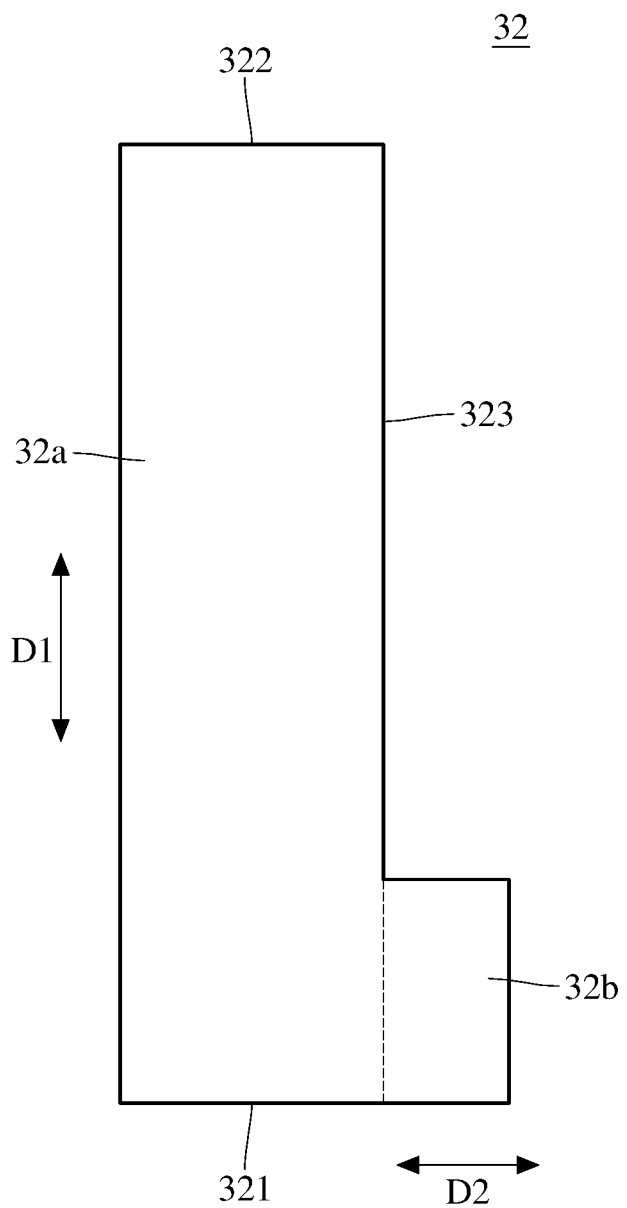
FIG. 10 is a planar view of a semi-finished first electrode in FIG. 9.

Please refer to FIG. 8, FIG. 9 and FIG. 10. FIG. 8 is a top view of a thermoelectric module connected to another thermoelectric module according to yet another embodiment of the disclosure, FIG. 9 is a side view of the thermoelectric modules in FIG. 8, and FIG. 10 is a planar view of a semi-finished first electrode in FIG. 9. In this embodiment, a thermoelectric module 3 and a thermoelectric module 3' are provided. The thermoelectric modules 3 and 3' are similar to the thermoelectric modules 2 and 2' in FIG. 6. The thermoelectric components 31 are located between the first electrode 32 and the second electrode 33, and are in parallel connection through the first electrode 32 and the second electrode 33. The thermoelectric components 31 are located between the first electrode 32' and the second electrode 33', and are in parallel connection through the first electrode 32' and the second electrode 33'. The first electrode 32 and the second electrode 33' are electrically connected to each other so that the thermoelectric module 3 and the thermoelectric module 3' are in serial connection. However, in this embodiment, the shapes of the first electrodes 32 and 32' and the second electrodes 33 and 33' are different from that in FIG. 6. As shown in FIG. 10, it shows a semi-finished first electrode 32, and it is noted that the shapes of the semi-finished first electrode 32' and the semi-finished second electrodes 33 and 33' are similar to or the same as the shape of the semi-finished first electrode 32.

The first electrode 32 includes a parallel connection part 32a and a serial connection part 32b. The parallel connection part 32a and the serial connection part 32b are integral with each other. The parallel connection part 32a has a first side 321, a second side 322 and a third side 323. The first side 321 and the second side 322 are opposite to each other, and the third side 323 is located between the first side 321 and the second side 322. The parallel connection part 32a extends along a first extension direction D1 substantially parallel to a direction pointing from the first side 321 toward the second side 322. As shown in FIG. 8, the thermoelectric components 31 are arranged along the first extension direction D1. The serial connection part 32b extends a distance from the third side 323 along a second extension direction D2. The second extension direction D2 is substantially parallel to the first side 321. The third side 323 is taken as a bend line, so the serial connection part 32b is able to be bent toward the second electrode 33 at the third side 323. That is, during the manufacturing process of the first electrode 32, the first electrode 32 is a whole sheet, and then some parts of the first electrode 32 are being cut out, and then the first electrode 32 is being bent.

In this embodiment, the serial connection part 32b is connected to an end part of the third side 323, but the present disclosure is not limited thereto. In some embodiments, the serial connection part 32b may be connected to a middle part of the third side 323 or a part close to the middle part of the third side 323.

Figure 11:
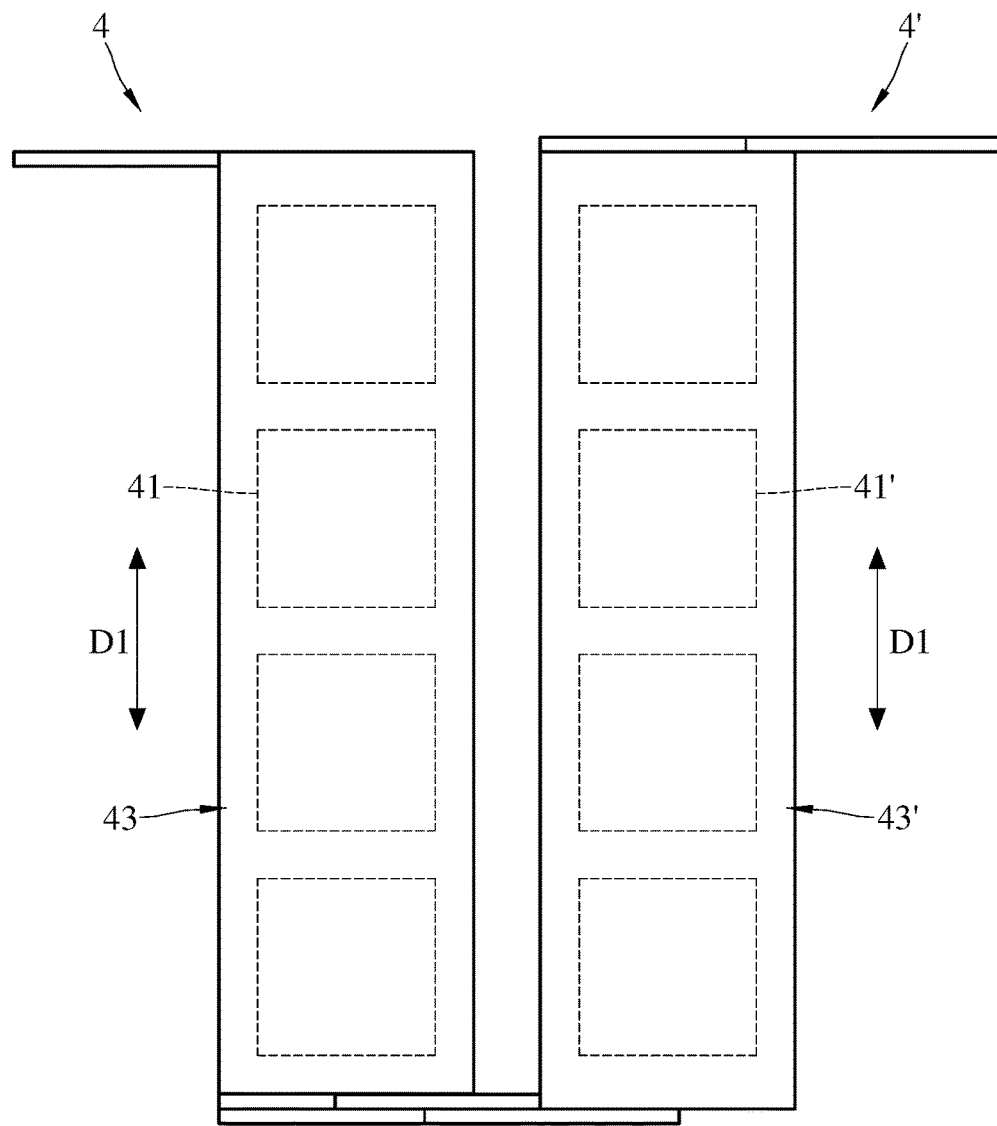
FIG. 11 is a top view of a thermoelectric module connected to another thermoelectric module according to still another embodiment of the disclosure.
Figure 12:
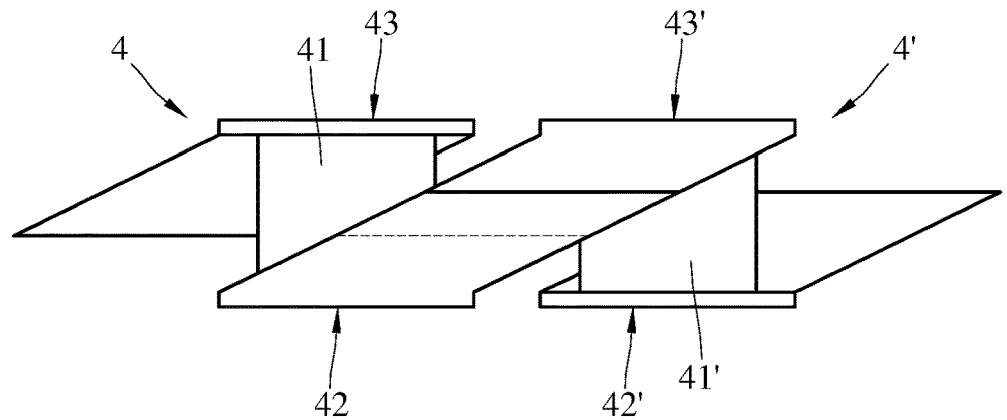
FIG. 12 is a side view of the thermoelectric modules in FIG. 11.
Figure 13:
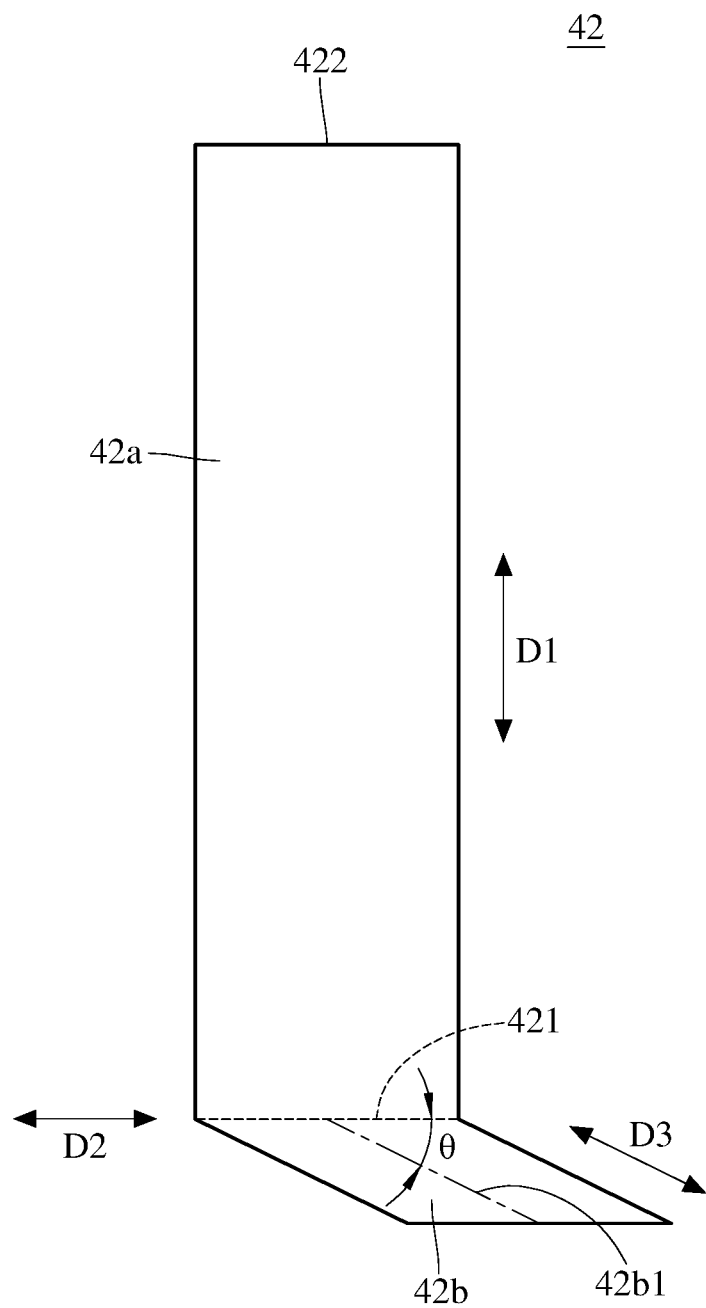
FIG. 13 is a planar view of a semi-finished first electrode in FIG. 12.

Please refer to FIG. 11, FIG. 12 and FIG. 13. FIG. 11 is a top view of a thermoelectric module connected to another thermoelectric module according to still another embodiment of the disclosure, FIG. 12 is a side view of the thermoelectric modules in FIG. 11, and FIG. 13 is a planar view of a semi-finished first electrode in FIG. 12. The thermoelectric components 41 are located between the first electrode 42 and the second electrode 43, and are in parallel connection through the first electrode 42 and the second electrode 43, the thermoelectric components 41' are located between the first electrode 42' and the second electrode 43', and are in parallel connection through the first electrode 42' and the second electrode 43'. The first electrode 42 and the second electrode 43' are electrically connected to each other, so the thermoelectric module 4 and the thermoelectric module 4' are in serial connection. However, in this embodiment, there are no base boards 14 and 15; in addition, the shapes of the first electrodes 42 and 42' and the second electrodes 43 and 43' are different from that in FIG. 2. FIG. 13 shows a semi-finished first electrode 42. It is noted that the shapes of the semi-finished first electrode 42' and the semi-finished second electrodes 43 and 43' are similar to or the same as the shape of the semi-finished first electrode 42.

The first electrode 42 includes a parallel connection part 42a and a serial connection part 42b. The parallel connection part 42a and the serial connection part 42b are integral with each other. The parallel connection part 42a has a first side 421 and a second side 422 opposite to each other. The parallel connection part 42a extends along a first extension direction D1 which is substantially parallel to a direction pointing from the first side 421 toward the second side 422. As shown in FIG. 11, the thermoelectric components 41 are arranged along the first extension direction D1. A second extension direction D2 is substantially parallel to the first side 421. The serial connection part 42b extends a distance from the first side 421 along a third extension direction D3. The serial connection part 42b has a middle line 42b1 substantially parallel to the third extension direction D3. An acute angle θ is between the second extension direction D2 and the third extension direction D3. The first side 421 is taken as a bend line, so the serial connection part 42b is able to be bent toward the second electrode 43 at the first side 421. That is, during the manufacturing process of the first electrode 42, the first electrode 42 is a whole sheet, and then some parts of the first electrode 42 are being cut out, and then the first electrode 42 is being bent.

Figure 14:
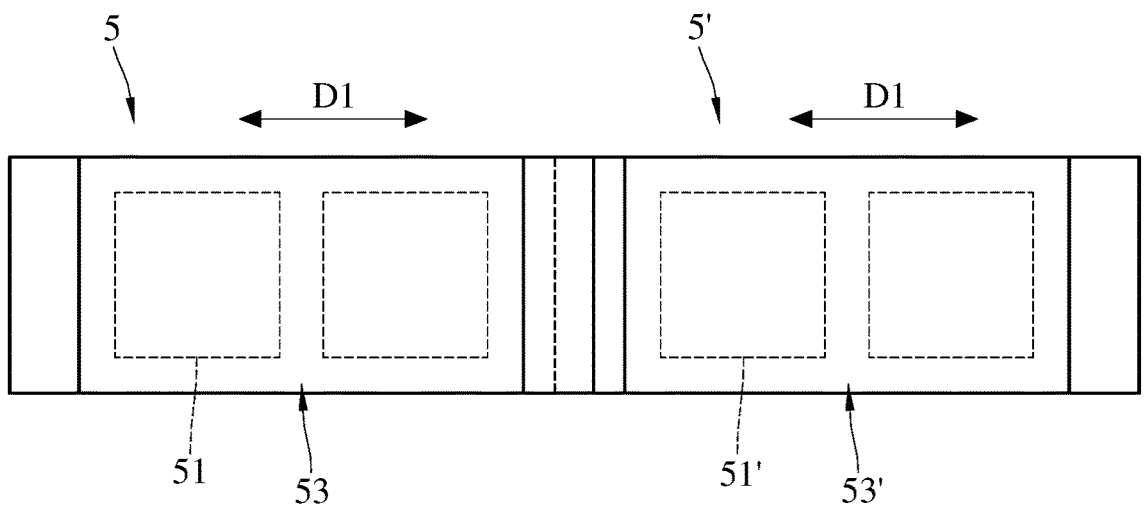
FIG. 14 is a top view of a thermoelectric module connected to another thermoelectric module according to still yet another embodiment of the disclosure.
Figure 15:
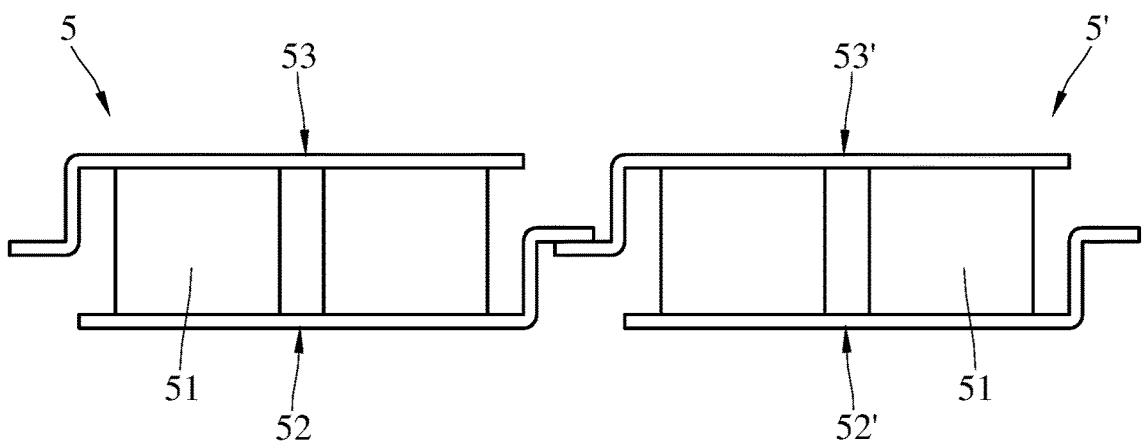
FIG. 15 is a side view of the thermoelectric modules in FIG. 14.
Figure 16:
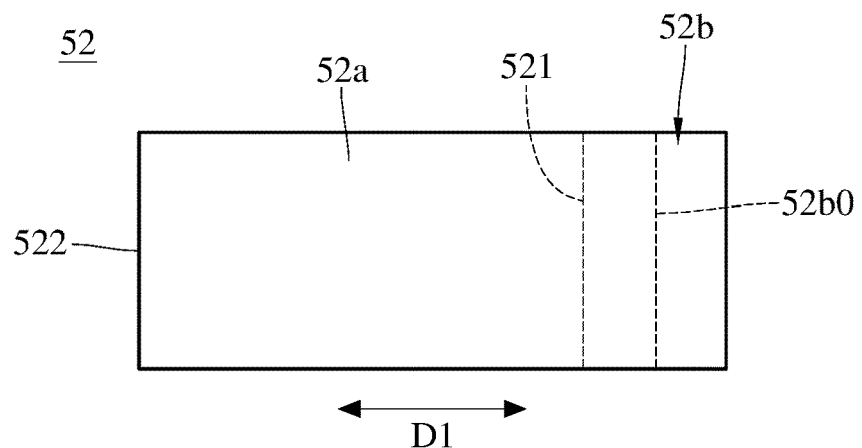
FIG. 16 is a planar view of a semi-finished first electrode in FIG. 15.

Please refer to FIG. 14, FIG. 15 and FIG. 16. FIG. 14 is a top view of a thermoelectric module connected to another thermoelectric module according to still yet another embodiment of the disclosure, FIG. 15 is a side view of the thermoelectric modules in FIG. 14, and FIG. 16 is a planar view of a semi-finished first electrode in FIG. 15. In this embodiment, a thermoelectric module 5 and a thermoelectric module 5' are provided. The thermoelectric modules 5 and 5' are similar to the thermoelectric modules 2 and 2' in FIG. 6, but the direction of the arrangement of the thermoelectric modules 5 and 5' is substantially the same as the direction of the arrangement of the thermoelectric components 51. The thermoelectric components 51 are located between the first electrode 52 and the second electrode 53, and are in parallel connection through the first electrode 52 and the second electrode 53. The thermoelectric components 51' are located between the first electrode 52' and the second electrode 53', and are in parallel connection through the first electrode 52' and the second electrode 53'. The first electrode 52 of the thermoelectric module 5 is electrically connected to the second electrode 53' of the thermoelectric module 5' so that the thermoelectric module 5 and the thermoelectric module 5' are in serial connection. However, in this embodiment, there are no base boards 14 and 15; in addition, the shapes of the first electrode 52 and 52' and the second electrodes 53 and 53' are different from that in FIG. 6. As shown in FIG. 16, it shows a semi-finished first electrode 52, and it is noted that the shapes of the semi-finished first electrode 52' and the semi-finished second electrodes 53 and 53' are similar to or the same as the shape of the semi-finished first electrode 52.

The first electrode 52 includes a parallel connection part 52a and a serial connection part 52b. The parallel connection part 52a and the serial connection part 52b are integral with each other. The parallel connection part 52a has a first side 521 and a second side 522 opposite to each other. The parallel connection part 52a extends along a first extension direction D1 which is substantially parallel to a direction pointing from the first side 521 toward the second side 522. As shown in FIG. 14, the thermoelectric components 51 are arranged along the first extension direction D1. The serial connection part 52b extends a distance from the first side 521 along the first extension direction D1. The first side 521 is taken as a bend line, so the serial connection part 52b is able to be bent toward the second electrode 53. In addition, the serial connection part 52b has another bend line 52b0 substantially parallel to the first side 521. The serial connection part 52b is able to be bent at the bend line 52b0, so that a part of the serial connection part 52b is able to be bent away from the thermoelectric component 51. That is, during the manufacturing process of the first electrode 52, the first electrode 52 is a whole sheet, and then some parts of the first electrode 52 are being cut out, and then the first electrode 52 is being bent.

Figure 17:
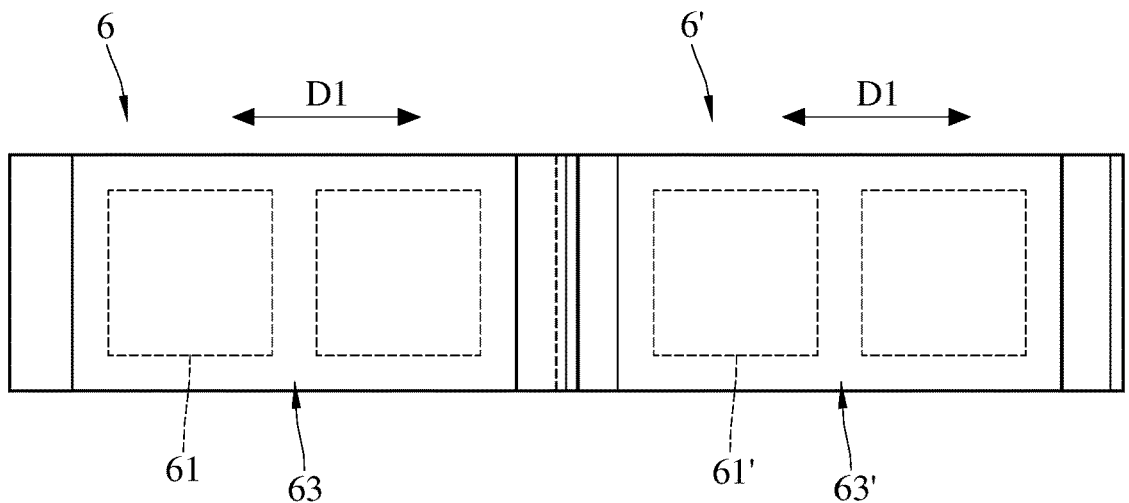
FIG. 17 is a top view of a thermoelectric module connected to another thermoelectric module according to yet a further embodiment of the disclosure.
Figure 18:
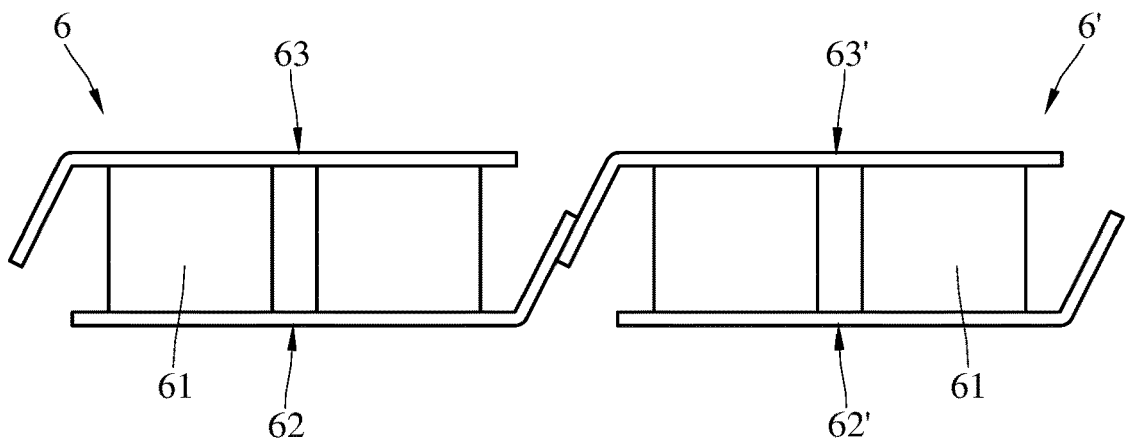
FIG. 18 is a side view of the thermoelectric modules in FIG. 17.
Figure 19:
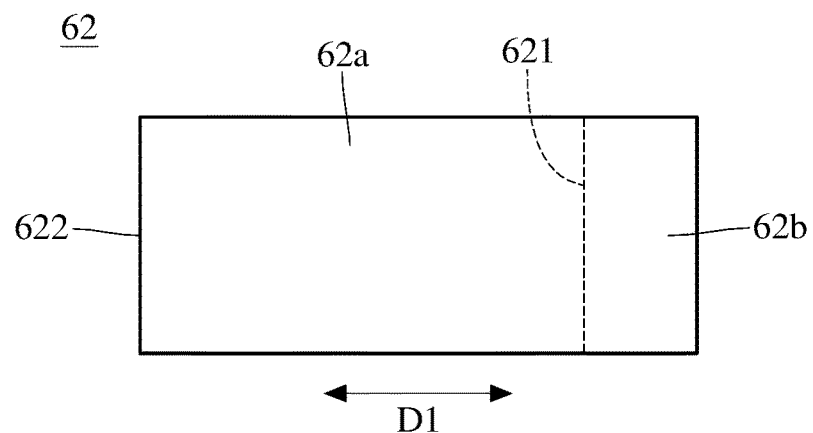
FIG. 19 is a planar view of a semi-finished first electrode in FIG. 18.

Please refer to FIG. 17, FIG. 18 and FIG. 19. FIG. 17 is a top view of a thermoelectric module connected to another thermoelectric module according to yet a further embodiment of the disclosure, FIG. 18 is a side view of the thermoelectric modules in FIG. 17, and FIG. 19 is a planar view of a semi-finished first electrode in FIG. 18. In this embodiment, a thermoelectric module 6 and a thermoelectric module 6' are provided. The thermoelectric modules 6 and 6' are similar to the thermoelectric modules 3 and 3' in FIG. 9, but the direction of the arrangement of the thermoelectric modules 6 and 6' is substantially the same as the direction of the arrangement of the thermoelectric components 61. The thermoelectric components 61 are located between the first electrode 62 and the second electrode 63, and are in parallel connection through the first electrode 62 and the second electrode 63. The thermoelectric components 61' are located between the first electrode 62' and the second electrode 63', and are in parallel connection through the first electrode 62' and the second electrode 63'. The first electrode 62 is electrically connected to the second electrode 63', so that the thermoelectric module 6 and the thermoelectric module 6' are in serial connection. However, the shapes of the first electrodes 62 and 62' and the second electrodes 63 and 63' are different from that in FIG. 9. FIG. 19 shows a semi-finished first electrode 62. It is noted that the shape of the semi-finished first electrode 62' and the semi-finished second electrodes 63 and 63' are similar to or the same as the shape of the semi-finished first electrode 62.

The first electrode 62 includes a parallel connection part 62a and a serial connection part 62b. The parallel connection part 62a and the serial connection part 62b are integral with each other. The parallel connection part 62a has a first side 621 and a second side 622 opposite to each other. The parallel connection part 62a extends along a first extension direction D1 which is substantially parallel to a direction pointing from the first side 621 toward the second side 622. As shown in FIG. 17, the thermoelectric components 61 are arranged along the first extension direction D1. The serial connection part 62b extends a distance from the first side 621 along the extension direction D1. The first side 621 is taken as a bend line, so the serial connection part 62b is able to be bent toward the second electrode 63. That is, during the manufacturing process of the first electrode 62, the first electrode 62 is a whole sheet, and then some parts of the first electrode 62 are being cut out, and then the first electrode 62 is being bent.

Figure 20:
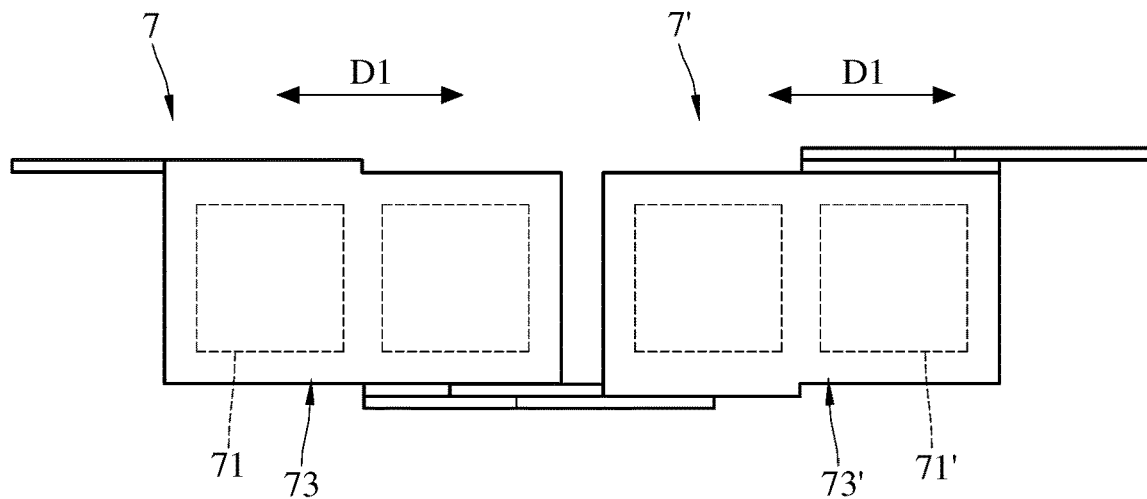
FIG. 20 is a top view of a thermoelectric module connected to another thermoelectric module according to still yet a further embodiment of the disclosure.
Figure 21:
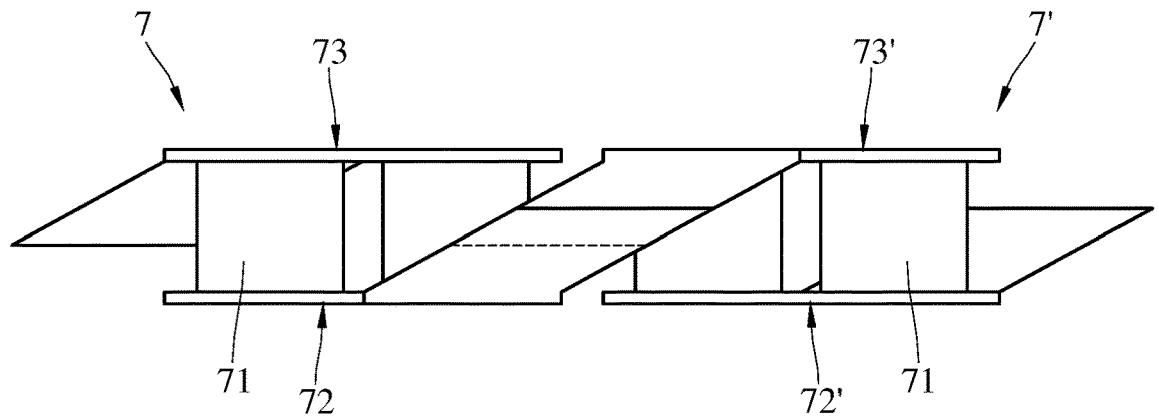
FIG. 21 is a side view of the thermoelectric modules in FIG. 20.
Figure 22:
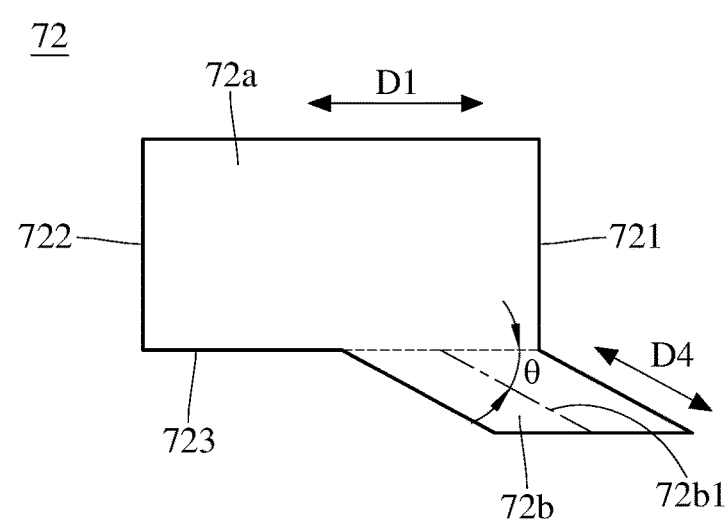
FIG. 22 is a planar view of a semi-finished first electrode in FIG. 21.

Please refer to FIG. 20, FIG. 21 and FIG. 22. FIG. 20 is a top view of a thermoelectric module connected to another thermoelectric module according to still yet a further embodiment of the disclosure, FIG. 21 is a side view of the thermoelectric modules in FIG. 20, and FIG. 22 is a planar view of a semi-finished first electrode in FIG. 21. In this embodiment, a thermoelectric module 7 and a thermoelectric module 7' are provided. The thermoelectric modules 7 and 7' are similar to the thermoelectric modules 4 and 4' in FIG. 12, but the direction of the arrangement of the thermoelectric modules 7 and 7' is substantially the same as the direction of the arrangement of the thermoelectric components 71. The thermoelectric components 71 are located between the first electrode 72 and the second electrode 73, and are in parallel connection through the first electrode 72 and the second electrode 73. The thermoelectric components 71' are located between the first electrode 72' and the second electrode 73', and are in parallel connection through the first electrode 72' and the second electrode 73'. The first electrode 72 is electrically connected to the second electrode 73' so that the thermoelectric module 7 and the thermoelectric module 7' are in serial connection. However, in this embodiment, the shapes of the first electrodes 72 and 72' and the second electrodes 73 and 73' are different from that in FIG. 12. FIG. 22 shows a semi-finished first electrode 72. It is noted that the shapes of the semi-finished first electrode 72' and the semi-finished second electrodes 73 and 73' are similar to or the same as the shape of the semi-finished first electrode 72.

The first electrode 72 includes a parallel connection part 72a and a serial connection part 72b. The parallel connection part 72a and the serial connection part 72b are integral with each other. The parallel connection part 72a has a first side 721, a second side 722 and a third side 723, the first side 721 and the second side 722 are opposite to each other, and the third side 723 is located between the first side 721 and the second side 722. The parallel connection part 72a extends along a first extension direction D1 which is substantially parallel to a direction pointing from the first side 721 toward the second side 722. As shown in FIG. 20, the thermoelectric components 71 are arranged along the first extension direction D1. The serial connection part 72b extends a distance from the third side 723 along a fourth extension direction D4. The serial connection part 72b has a middle line 72b1 substantially parallel to the fourth extension direction D4. An acute angle θ is between the first extension direction D1 and the fourth extension direction D4. The third side 723 is taken as a bend line, so the serial connection part 72b is able to be bent toward the second electrode 73. That is, during the manufacturing process of the first electrode 72, the first electrode 72 is a whole sheet, and then some parts of the first electrode 72 are being cut out, and then the first electrode 72 is being bent.

In this embodiment, the serial connection part 72b is connected to an end part of the third side 723, but the present disclosure is not limited thereto. In other embodiments, the serial connection part 72b may be connected to a middle part of the third side 723 or a part close to the middle part of the third side 723.

Figure 23:
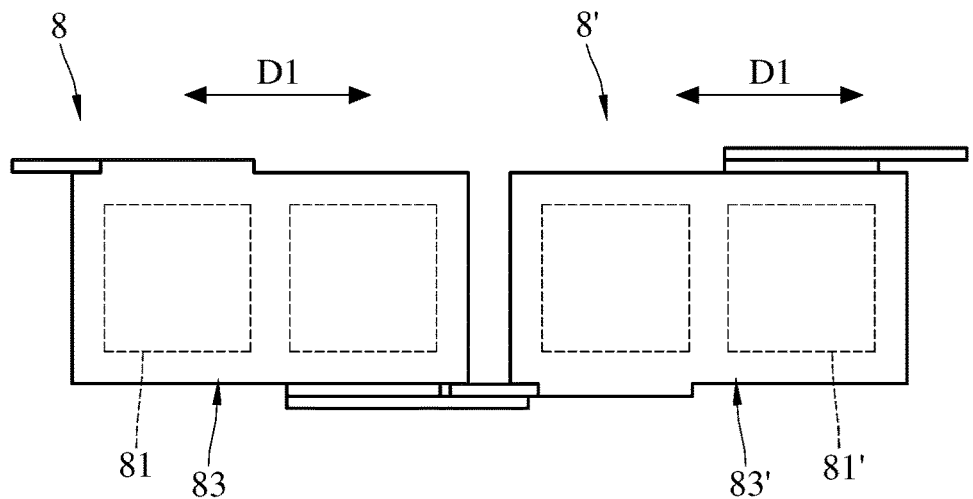
FIG. 23 is a top view of a thermoelectric module connected to another thermoelectric module according to still yet another embodiment of the disclosure.
Figure 24:
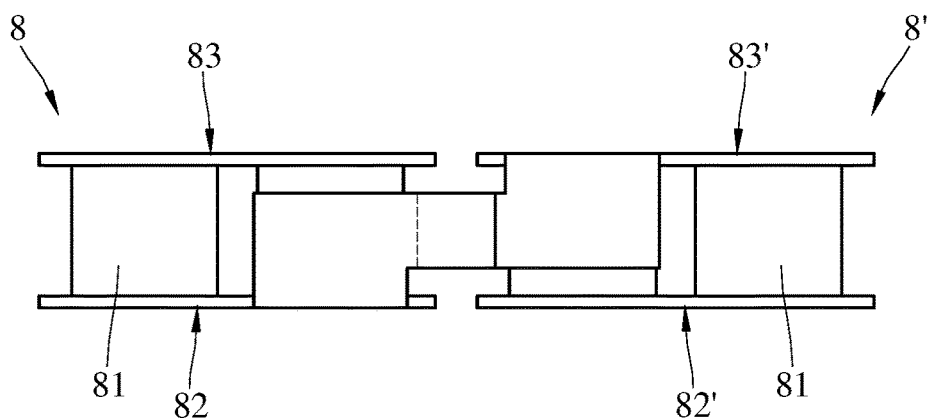
FIG. 24 is a side view of the thermoelectric modules in FIG. 23.
Figure 25:
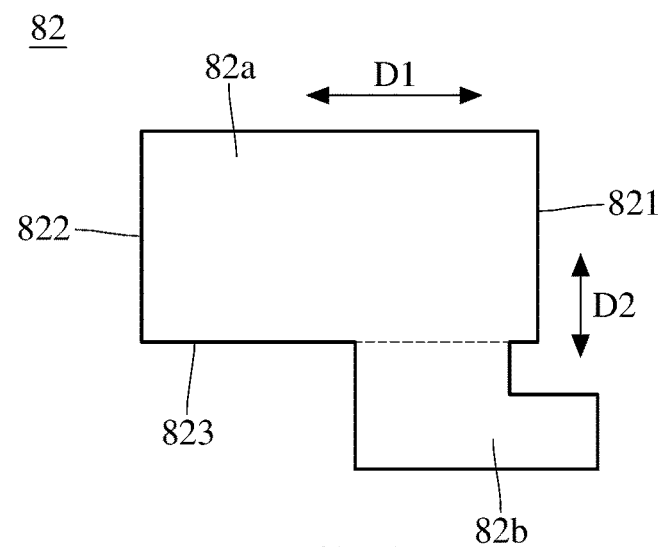
FIG. 25 is a planar view of a semi-finished first electrode in FIG. 24.

Please refer to FIG. 23, FIG. 24 and FIG. 25. FIG. 23 is a top view of a thermoelectric module connected to another thermoelectric module according to still yet another embodiment of the disclosure, FIG. 24 is a side view of the thermoelectric modules in FIG. 23, and FIG. 25 is a planar view of a semi-finished first electrode in FIG. 24. In this embodiment, a thermoelectric module 8 and a thermoelectric module 8' are provided. The thermoelectric modules 8 and 8' are similar to the thermoelectric modules 1 and 1' in FIG. 2, but the direction of the arrangement of the thermoelectric modules 8 and 8' is substantially the same as the thermoelectric components 81. The thermoelectric components 81 are located between the first electrode 82 and the second electrode 83, and are in parallel connection through the first electrode 82 and the second electrode 83. The thermoelectric components 81' are located between the first electrode 82' and the second electrode 83', and are in parallel connection through the first electrode 82' and the second electrode 83'. The first electrode 82 is electrically connected to the second electrode 83', so the thermoelectric modules 8 and 8' are in serial connection. However, in this embodiment, the shapes of the first electrodes 82 and 82' and the second electrodes 83 and 83' are different from that in FIG. 2. FIG. 25 shows a semi-finished first electrode 82. It is noted that the shapes of the semi-finished first electrode 82' and the semi-finished second electrodes 83 and 83' are similar to or the same as the shape of the semi-finished first electrode 82.

The first electrode 82 includes a parallel connection part 82a and a serial connection part 82b. The parallel connection part 82a and the serial connection part 82b are integral with each other. The parallel connection part 82a has a first side 821, a second side 822 and a third side 823, the first side 821 and the second side 822 are opposite to each other, and the third side 823 is located between the first side 821 and the second side 822. The parallel connection part 82a extends along a first extension direction D1 which is substantially parallel to a direction pointing from the first side 821 toward the second side 822. As shown in FIG. 23, the thermoelectric components 81 are arranged along the first extension direction D1. The serial connection part 82b extends a distance from the third side 823 along a second extension direction D2, and then extends another distance along the first extension direction D1. A second extension direction D2 is substantially parallel to the first side 821. The third side 823 is taken as a bend line, so the serial connection part 82b is able to be bent toward the second electrode 83. That is, during the manufacturing process of the first electrode 82, the first electrode 82 is a whole sheet, and then some parts of the first electrode 82 are being cut out, and then the first electrode 82 is being bent.

In this embodiment, the serial connection part 82b is connected to a middle part of the third side 823, but the present disclosure is not limited thereto. In other embodiments, the serial connection part 82b may be connected to a middle part of the third side 823 or a part close to the end part of the third side 823.

Figure 26:
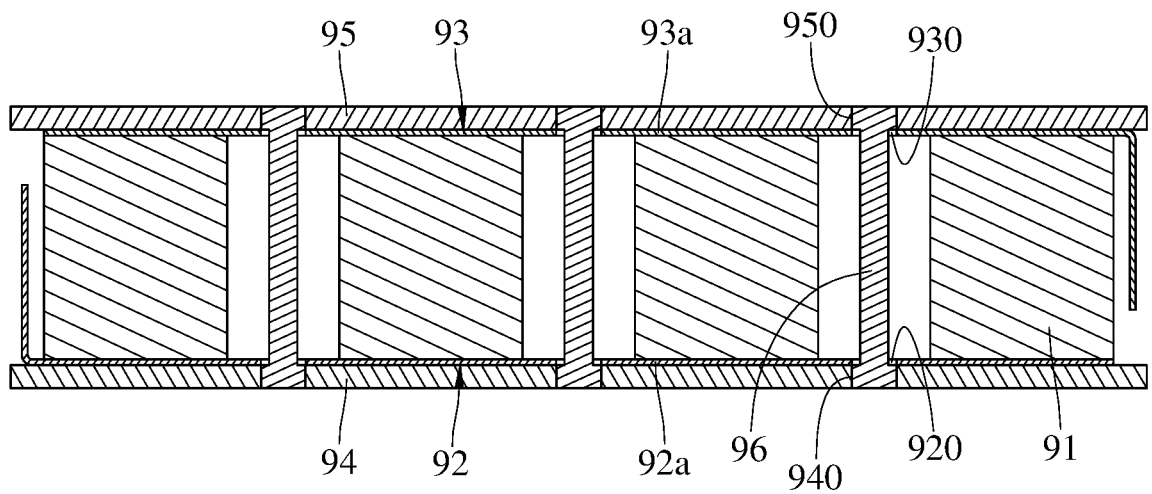
FIG. 26 is a side view of a thermoelectric module according to still yet further another embodiment of the disclosure.

Please refer to FIG. 26. FIG. 26 is a side view of a thermoelectric module according to still yet further another embodiment of the disclosure. In this embodiment, a thermoelectric module 9 is provided. The thermoelectric module 9 is similar to the thermoelectric module 1 in FIG. 2. In this embodiment, the thermoelectric components 91 are located between the first electrode 92 and the second electrode 93, and are in parallel connection through the first electrode 92 and the second electrode 93. The first base board 94 is disposed on the first electrode 92, and the second base board 95 is disposed on the second electrode 93. In addition, the thermoelectric module 9 further includes a plurality of supporting pillars 96 respectively located between each thermoelectric component 91. Two portions of each supporting pillar 96 are connected to the parallel connection part 92a of the first electrode 92 and the parallel connection part 93a of the second electrode 93. In this embodiment, one end of each supporting pillar 96 penetrates through one of the buffering holes 920 of the parallel connection part 92a of the first electrode 92, and is embedded into one of the buffering holes 940 of the first base board 94 in order to be fixed to the first base board 94. The other end of each supporting pillar 96 penetrates through one of the buffering holes 930 of the parallel connection part 93a of the second electrode 93, and is embedded into one of the buffering holes 950 of the second base board 95 in order to be fixed to the second base board 95. An inner diameter of each buffering hole 920 of the parallel connection part 92a of the first electrode 92 and an inner diameter of each buffering hole 930 of the parallel connection part 93a of the second electrode 93 both greater than an external diameter of each supporting pillar 96. The supporting pillars 96 are not in contact with the first electrode 92 and the second electrode 93.

However, the present disclosure is not limited to the aforementioned disposing way of the supporting pillars 96. In some embodiments, one end of each supporting pillar 96 may protrude from the first base board 94; or the other end of each supporting pillar 96 may protrude from the second base board 95. In some embodiments, two ends of each supporting pillar 96 may be respectively fixed to the parallel connection part 92a of the first electrode 92 and the parallel connection part 93a of the second electrode 93 via adhering or welding. In some embodiments, one end of each supporting pillar 96 may be fixed to the parallel connection part 92a of the first electrode 92, and the other end of each supporting pillar 96 may penetrate through one of the buffering holes 930 of the parallel connection part 93a of the second electrode 93 so as to be fixed to one of the buffering holes 950 of the second base board 95 without protruding from the second base board 95. In some embodiments, one end of each supporting pillar 96 penetrates through one of the buffering holes 920 of the parallel connection part 92a of the first electrode 92, and is fixed to one of the buffering holes 940 of the first base board 94, the other end of each supporting pillar 96 may protrude from or not protrude from the first base board 94 in order to be fixed to the parallel connection part 93a of the second electrode 93.

According to the thermoelectric module as discussed above, since the thermoelectric components, which have the same type of semiconductor material, are in parallel connection through the parallel connection parts of the electrodes, so there is no need to spend time to arrange thermoelectric components made of different materials in an alternate manner during manufacturing process, and the thermoelectric module has consistent thermoelectric performance. In addition, there is no need to prepare thermoelectric components in different materials. As a result, the thermoelectric module of one embodiment of the present disclosure is easy to be manufactured.

Furthermore, the thermoelectric module is able to be electrically connected to other electrical components via the serial connection part of the electrode, and the thermoelectric components are able to be in parallel connection via the parallel connection part of the electrode; thus, the electrode of the thermoelectric module is favorable for saving the time on the process of electrical connection.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A thermoelectric module, comprising:
a plurality of thermoelectric components having the same type of semiconductor material;
a first electrode comprising a first parallel connection part and a first serial connection part, the plurality of thermoelectric components being connected to and arranged along the first parallel connection part and each of the plurality of thermoelectric components separated from one another, wherein the first parallel connection part has a first side and a second side opposite to each other, the first parallel connection part extends along a first extension direction pointing from the first side toward the second side, the plurality of thermoelectric components are arranged along the first extension direction, and the first serial connection part includes a first portion and a second portion connected to each other, the first portion of the first serial connection part extends from the first side along the first extension direction, and the second portion of the first serial connection part extends along a second extension direction perpendicular to the first extension direction; and
a second electrode, being connected to and arranged with the plurality of thermoelectric components, and the plurality of thermoelectric components being connected to and located between the first parallel connection part and the second electrode.

2. The thermoelectric module according to claim 1, wherein the plurality of thermoelectric components is made of p-type semiconductor material or n-type semi conductor material.

3. The thermoelectric module according to claim 1, wherein the first parallel connection part has at least one buffering hole or at least one buffering notch, and the at least one buffering hole or the at least one buffering notch is located between the plurality of thermoelectric components.

4. The thermoelectric module according to claim 1, wherein the second electrode comprises a second parallel connection part and a second serial connection part, the plurality of thermoelectric components are connected to and arranged along the second parallel connection part.

5. The thermoelectric module according to claim 1, further comprising at least one supporting pillar, the at least one supporting pillar located between the plurality of thermoelectric components, and two portions of the at least one supporting pillar being respectively disposed on the first parallel connection part of the first electrode and the second electrode.

6. The thermoelectric module according to claim 1, further comprising a base board disposed on the first electrode.

7. The thermoelectric module according to claim 6, wherein the base board has at least one buffering hole or at least one buffering notch, located between the plurality of thermoelectric components.

8. The thermoelectric module according to claim 1, wherein the first serial connection part and the first parallel connection part are integral with each other.

9. The thermoelectric module according to claim 1, wherein there is a second extension direction substantially parallel to the first side, there is an acute angle between a third extension direction and the second extension direction, and the first serial connection part extends from the first side along the third extension direction.

10. The thermoelectric module according to claim 1, wherein the first parallel connection part has a first side, a second side and a third side, the first side and the second side are opposite to each other, the third side is located between the first side and the second side, the first parallel connection part extends along a first extension direction, the first extension direction is substantially parallel to a direction pointing from the first side toward the second side, the plurality of thermoelectric components is arranged along the first extension direction, and the first serial connection part extends from the third side.

11. The thermoelectric module according to claim 10, wherein the first serial connection part extends from the third side along a second extension direction, and the second extension direction is substantially parallel to the first side.

12. The thermoelectric module according to claim 10, wherein the first serial connection part includes a first portion and a second portion connected to each other, the first portion extends from the third side along a second extension direction, the second portion extends along the first extension direction, and the second extension direction is substantially parallel to the first side.

13. The thermoelectric module according to claim 10, wherein the first serial connection part extends from the third side along a second extension direction, and there is an acute angle between the second extension direction and the first extension direction.

* * * * *